US006518602B1

(12) United States Patent
Yuasa et al.

(10) Patent No.: US 6,518,602 B1
(45) Date of Patent: Feb. 11, 2003

(54) NITRIDE COMPOUND SEMICONDUCTOR LIGHT EMITTING DEVICE AND METHOD FOR PRODUCING THE SAME

(75) Inventors: Takayuki Yuasa, Nara (JP); Masaya Ishida, Kashiba (JP); Yuhzoh Tsuda, Tenri (JP); Mototaka Taneya, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/653,817

(22) Filed: Sep. 1, 2000

(30) Foreign Application Priority Data

Sep. 3, 1999 (JP) ............................................. 11-249670

(51) Int. Cl.[7] .............................................. H01L 33/00
(52) U.S. Cl. ........................ 257/102; 257/97; 257/103
(58) Field of Search ............................ 257/97, 102, 103

(56) References Cited

U.S. PATENT DOCUMENTS 6,057,565 A * 5/2000 Yoshida ...................... 257/102

OTHER PUBLICATIONS

Kuramoto, M. et al., (1999) "Room-temperature continous-wave operation of InGaN multi-quantum-well laser diodes grown on an n-GaN substrate with a backside n-contact" *Jpn. J. Appl. Phys.* 38:L184–L186.

* cited by examiner

Primary Examiner—Jerome Jackson
(74) Attorney, Agent, or Firm—Morrison & Foerster LLP

(57) ABSTRACT

A nitride compound semiconductor light emitting device of the present invention includes: a nitride compound semiconductor substrate; and a light emitting device section including a nitride compound semiconductor provided on the nitride compound semiconductor substrate. The nitride compound semiconductor substrate contains a group VII element as an impurity.

12 Claims, 14 Drawing Sheets

NITRIDE COMPOUND SEMICONDUCTOR LIGHT EMITTING DEVICE AND METHOD FOR PRODUCING THE SAME

BACKGROUND OF THE INVENTION

1. Field of the Invention

The present invention relates to a nitride compound semiconductor light emitting device produced on a nitride compound semiconductor substrate and a method for producing the same.

2. Description of the Related Art

In the prior art, nitride compound semiconductors have been used in or studied for use in light emitting devices and high power devices, utilizing their advantageous characteristics.

For example, a nitride compound semiconductor light emitting device can technically be capable of emitting light of a wide range of wavelengths, e.g., from violet to orange, by appropriately adjusting the composition thereof. In recent years, blue light emitting diodes and green light emitting diodes have been put into practical use utilizing the advantageous characteristics of nitride compound semiconductors. As semiconductor laser devices, blue-violet semiconductor laser devices have also been developed in the art.

When producing a nitride compound semiconductor film, sapphire, SiC, spinel, Si, GaAs, GaN, or the like, may be used as a substrate. Where sapphire, for example, is used as a substrate, a GaN or AlN buffer layer is formed at a low temperature of 500° C. to 600° C. prior to the epitaxial growth of a GaN film. Thereafter, the substrate is heated to a high temperature of 1000° C. to 1100° C. and a nitride compound semiconductor film is epitaxially grown. It is known in the art that in this way, it is possible to obtain a structurally and electrically desirable crystal also having a good surface condition. It is also known in the art that where SiC is used as a substrate, it is desirable to use a thin AlN film as a buffer layer at a growth temperature at which an epitaxial growth process is performed.

However, where a substrate other than a nitride compound semiconductor substrate, e.g., a GaN substrate, is used, a large amount of defects (e.g., dislocations) may be introduced into the produced nitride compound semiconductor due to differences in thermal expansion coefficient and in lattice constant between the substrate and the nitride compound semiconductor film grown thereon. The total density of such defects may be as high as about $1\times10^9$ cm$^{-1}$ to $1\times10^7$ cm$^{-2}$. Dislocations of such a density are known to trap the carriers which control the electrical conduction of the nitride compound semiconductor substrate, thereby deteriorating the electrical characteristics of the produced film. Such dislocations are also known to shorten the operating lifetime of a laser device which uses a high level current.

In order to reduce the resulting lattice defects and to improve the electrical characteristics, various methods have been tried in the art, including a hydride vapor phase epitaxy (H-VPE), a high pressure synthesis method, a sublimation method, and the like, to form a thick film of a nitride compound semiconductor, e.g., GaN, having a thickness of about 20 μm or more, which can be used as a nitride compound semiconductor thick film substrate.

By using such a nitride compound semiconductor thick film substrate, it is possible to reduce the density of defects reaching the substrate surface and to obtain a light emitting device having desirable characteristics.

However, even with such a nitride compound semiconductor thick film having a thickness over 20 μm on which a nitride compound semiconductor film is epitaxially grown (hereinafter, referred to also as a "nitride compound semiconductor substrate"), edge dislocations which extend in a direction perpendicular to the C axis are not completely eliminated and an amount of dislocations of about $1\times10^6$ cm$^{-2}$ or more still exists. It has been found that such dislocations, even though the amount thereof is reduced by an order of magnitude as compared with those resulting when using other types of substrates, adversely affect the emission intensity and the operating lifetime of a light emitting device such as a laser diode (hereinafter, referred to also as a "laser device") to which a high density current is injected.

A nitride compound semiconductor substrate doped with no impurity exhibits a high electrical resistance. Such an electrical resistance has to be reduced by doping with an impurity. However, a number of problems arise when a certain amount of impurity is injected during growth of a GaN thick film by using an N-VPE method, or the like, as in the prior art. For example, when a nitride compound semiconductor substrate which has been produced by injecting a certain amount of high concentration impurity thereinto is used in a nitride compound semiconductor laser device, the threshold voltage is reduced, but the thermal current density increases on the other hand. This is due to a mutual diffusion which occurs through dislocations in the crystal between an impurity doped into the nitride compound semiconductor substrate and an impurity doped into a film which is epitaxially grown on the substrate as a part of the light emitting device structure. Thus, a current barrier is partially formed at the interface between the nitride compound semiconductor substrate and the epitaxially grown film. This gives rise to adverse influences, e.g., an increase in the driving voltage of the light emitting device and a reduction in the operating lifetime of the light emitting device.

Moreover, regarding the surface morphology of the nitride compound semiconductor substrate doped with a high concentration of an impurity, such a nitride compound semiconductor substrate has a substantial surface roughness as compared with that of nitride compound semiconductor substrates. Therefore, although a laser device produced on such a substrate has a reduced threshold voltage, the threshold current density tends to increase due to scattering of propagated light caused by the substantial surface roughness.

In order to provide a light emitting device having improved electrical characteristics and a desirable operating lifetime, it has been desired to produce a nitride compound semiconductor substrate having a substrate surface (hereinafter, referred to also as a "growth surface") on which a nitride compound semiconductor film is epitaxially grown with a reduced dislocation density and a desirable electrical contact between the substrate and the epitaxially grown film.

SUMMARY OF THE INVENTION

In order to solve these problems, it is important to reduce the defect density of the nitride compound semiconductor substrate and to appropriately control the electrical contact between the growth surface of the nitride compound semiconductor substrate and the epitaxially grown film on the nitride compound semiconductor substrate.

According to one aspect of this invention, there is provided a nitride compound semiconductor light emitting device, including: a nitride compound semiconductor substrate; and a light emitting device section including a nitride compound semiconductor provided on the nitride compound semiconductor substrate. The nitride compound semiconductor substrate contains a group VII element as an impurity.

In one embodiment of the invention, the nitride compound semiconductor substrate contains as its main components nitride and gallium.

Thus, a group VII element having a large ion radius is introduced into a crystal of another element having a small ion radius (e.g., nitrogen, gallium, or aluminum) which forms the nitride compound semiconductor substrate, thereby stopping the propagation of displacements to the surface of the crystal. As a result, the dislocation density in the surface of the nitride compound semiconductor substrate is reduced. The use of such a substrate increases the emission intensity and the operating lifetime of the light emitting device epitaxially grown on the nitride compound semiconductor substrate.

In one embodiment of the invention, the light emitting device section includes: a nitride compound layer of a first conductivity type; a cladding layer of the first conductivity type provided on the nitride compound layer of the first conductivity type; a light propagation layer of the first conductivity type provided on the cladding layer of the first conductivity type; a well layer provided on the light propagation layer of the first conductivity type; a carrier blocking layer of a second conductivity type provided on the well layer; a light propagation layer of the second conductivity type provided on the carrier blocking layer of the second conductivity type; a cladding layer of the second conductivity type provided on the light propagation layer of the second conductivity type; and a contact layer of the second conductivity type provided on the cladding layer of the second conductivity type.

In one embodiment of the invention, the nitride compound semiconductor substrate has a thickness of 20 $\mu$m or more. Thus, the propagation of dislocations to the surface of the crystal is stopped.

As a result, the dislocation density in the surface of the nitride compound semiconductor substrate is reduced.

In one embodiment of the invention, a concentration of the group VII element contained in the nitride compound semiconductor substrate is equal to or greater than $2 \times 10^{14}$ cm$^{-3}$ and less than or equal to $2 \times 10^{20}$ cm$^{-3}$.

Thus, the effect of reducing the dislocation density is optimized, thereby improving the emission intensity and the operating lifetime of the light emitting device.

In one embodiment of the invention, the group VII element is chlorine.

Thus, it is possible to reduce the dislocations in a manner most suitable for a GaN substrate, thereby increasing the emission intensity and the operating lifetime of the light emitting device epitaxially grown on the nitride compound semiconductor substrate.

In one embodiment of the invention, the nitride compound semiconductor substrate contains an impurity for controlling electrical conduction characteristics of the nitride compound semiconductor substrate.

Thus, the chlorine doping reduces the edge dislocations in the crystal, thereby reducing the diffusion of the impurity for controlling the electrical conduction characteristics of the nitride compound semiconductor substrate into the epitaxially grown film through the edge dislocations. As a result, the voltage-current characteristics and the operating lifetime of the light emitting device epitaxially grown on the nitride compound semiconductor substrate.

In one embodiment of the invention, the impurity for controlling the electrical conduction characteristics of the nitride compound semiconductor substrate is at least one element selected from the group consisting of silicon, germanium, carbon, selenium, sulfur and oxygen. A concentration of the at least one element is equal to or greater than $1 \times 10^{17}$ cm$^{-3}$ and less than or equal to $5 \times 10^{20}$ cm$^{-3}$.

In one embodiment of the invention, the group VII element is chlorine; and a concentration of the chlorine contained in the nitride compound semiconductor substrate is equal to or greater than $1 \times 10^{15}$ cm$^{-3}$ and less than or equal to $1 \times 10^{20}$ cm$^{-3}$.

Thus, the reduction in the edge dislocations in the nitride compound semiconductor substrate which exhibits an n-type conductivity is optimized and the reduction in the impurity diffusion is also optimized. As a result, a light emitting device epitaxially grown on the nitride compound semiconductor substrate which has been optimized with such conditions has improved voltage-current characteristics and a prolonged operating lifetime.

In one embodiment of the invention, the concentration of the group VII element contained in the nitride compound semiconductor substrate in the vicinity of a surface of the nitride compound semiconductor substrate on which the light emitting device section is deposited is greater than that in other portions of the nitride compound semiconductor substrate.

Thus, as compared with a case where a high concentration of chlorine is doped across the entire area of the nitride compound semiconductor substrate, it is possible to reduce the surface roughness of the nitride compound semiconductor substrate. In addition, by the coexistence of the impurity for controlling the electrical conduction characteristics of the nitride compound semiconductor substrate, it is possible to reduce the Schottky barrier which is localized at the interface between the substrate and the epitaxially grown film, thereby further improving the voltage-current characteristics of the epitaxially grown light emitting device, reducing the threshold voltage and improving the operating lifetime.

In one embodiment of the invention, the group VII element is chlorine; and a concentration of the chlorine in a region of the nitride compound semiconductor substrate at a depth of 2 $\mu$m or less from the surface of the nitride compound semiconductor substrate is greater than those in other regions of the nitride compound semiconductor substrate.

In one embodiment of the invention, the group VII element is chlorine; and a concentration of the chlorine in a region of the nitride compound semiconductor substrate at a depth of about 0.05 $\mu$m from the surface of the nitride compound semiconductor substrate is equal to or greater than $1 \times 10^{16}$ cm$^{-3}$ and less than or equal to $1 \times 10^{20}$ cm$^{-3}$.

Thus, the reduction in the dislocations in the surface of the nitride compound semiconductor substrate and the reduction in the surface roughness thereof are optimized, and the voltage-current characteristics, the threshold current and the operating lifetime of the light emitting device epitaxially grown on the substrate are optimized.

According to another aspect of this invention, there is provided a method for producing a nitride compound semiconductor light emitting device by forming a light emitting device section containing a nitride compound semiconductor on a nitride compound semiconductor substrate, the method including the steps of: forming the nitride compound semiconductor substrate on a nitride compound semiconductor layer, the nitride compound semiconductor substrate containing as impurities a group VII element and an element for controlling an electrical conduction characteristics of the nitride compound semiconductor substrate; and forming the light emitting device section containing a nitride compound semiconductor on the nitride compound semiconductor substrate.

In one embodiment of the invention, the step of forming the light emitting device section includes the steps of: forming a nitride compound layer of a first conductivity type on the nitride compound semiconductor substrate; forming a cladding layer of the first conductivity type on the nitride compound layer of the first conductivity type; forming a light propagation layer of the first conductivity type on the cladding layer of the first conductivity type; forming a well layer on the light propagation layer of the first conductivity type; forming a carrier blocking layer of a second conductivity type on the well layer; forming a light propagation layer of the second conductivity type on the carrier blocking layer of the second conductivity type; forming a cladding layer of the second conductivity type on the light propagation layer of the second conductivity type; and forming a contact layer of the second conductivity type on the cladding layer of the second conductivity type.

In one embodiment of the invention, the nitride compound semiconductor substrate contains as its main components nitride and gallium.

In one embodiment of the invention, the group VII element is chlorine.

In one embodiment of the invention, the nitride compound semiconductor layer includes a striped growth suppression film.

With such a production method, it is possible to control the concentration of an impurity and to provide a concentration gradient of the impurity. Thus, the present invention solves the above-described problems in the prior art.

Thus, the invention described herein makes possible the advantage of providing a light emitting device having desirable electrical characteristics and a desirable operating lifetime.

This and other advantages of the present invention will become apparent to those skilled in the art upon reading and understanding the following detailed description with reference to the accompanying figures.

DESCRIPTION OF THE PREFERRED EMBODIMENTS

Embodiment 1

The present invention will be further described below. While an H-VPE method, a high pressure synthesis method and a sublimation method can be used to produce a nitride compound semiconductor thick film having a thickness over 20 $\mu$m on which a nitride compound semiconductor film is epitaxially grown (a "nitride compound semiconductor substrate"), it is most preferred to employ an H-VPE method for growth of a sapphire substrate in order to grow a thick large-area film without an uneven distribution. In this embodiment, an example where a thick GaN film is grown on a sapphire substrate by the H-VPE method to produce a nitride compound semiconductor substrate will be described.

First, a sapphire substrate having a (0001) face is washed, and a GaN film having a thickness of about 3 $\mu$m is grown as an underlying layer by using an MOCVD method according to the following procedure. The washed sapphire substrate is placed in an MOCVD apparatus for cleaning in an $H_2$ atmosphere and at a high temperature of about 1100° C. Thereafter, the temperature is reduced, and 5 l/min and 20 mol/min of $NH_3$ and trimethylgallium (TMG), respectively, are introduced into the apparatus at 600° C. while supplying 10 l/min of hydrogen ($H_2$) as a carrier gas into the apparatus, thereby growing a GaN low temperature buffer layer having a thickness of about 20 nm. Then, the supply of TMG is stopped, the temperature is again increased to about 1050° C., and about 100 mol/min of TMG is introduced into the apparatus, thereby growing a GaN film having a thickness of about 3 $\mu$m in one hour. Thereafter, the supply of the TMG and $NH_3$ is stopped, the temperature is reduced to room temperature, and the sapphire substrate on which the GaN underlying layer has been grown is taken out of the apparatus. The material of the low temperature buffer layer is not limited to GaN. Alternatively, trimethylaluminum (TMA), TMG and $NH_3$ may be used to provide an AlN film or a GaAlN film.

Then, on the sapphire substrate on which a GaN underlying layer has been grown as described above, a thick film is grown as follows. In order to prevent a crack from occurring, a growth suppression film having a thickness of about 0.2 μm is formed in a stripe pattern with a 7 μm width and a 10 μm interval, and a selective growth process is performed thereon by using an H-VPE method, thereby growing a flat GaN thick film. The growth suppression film for use in this example is obtained by photolithographically etching an $SiO_2$ film which has been obtained by vapor deposition using a sputtering method.

Figure 2:
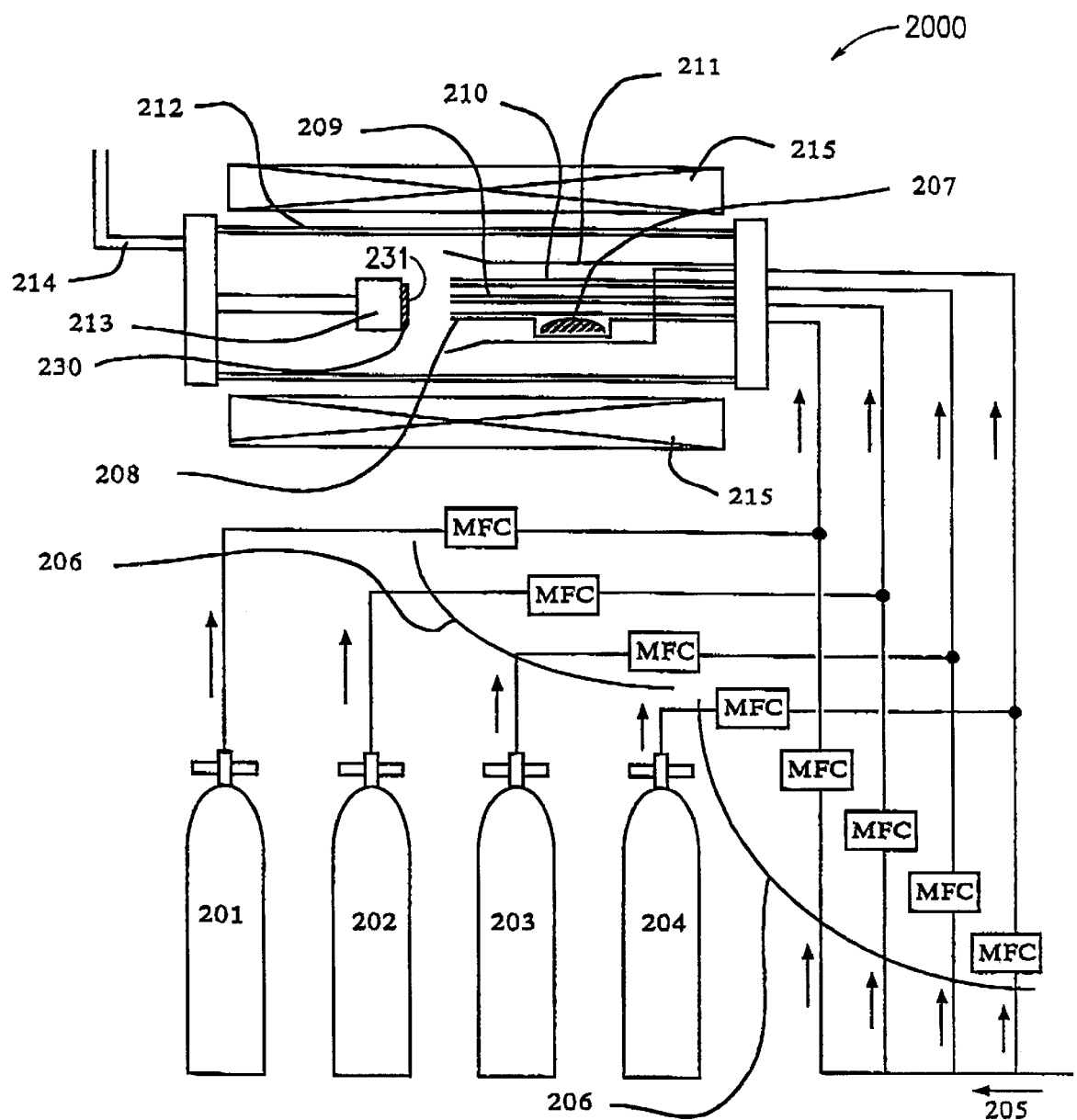
FIG. 2 is a schematic diagram illustrating a thick film production apparatus used for producing a nitride compound semiconductor substrate according to one embodiment of the present invention.

A method for growing a GaN thick film by an H-VPE method will be described with reference to FIG. 2. A sapphire substrate 230 having an GaN underlying layer grown thereon which includes a striped growth suppression film 231 produced as described above is placed into an H-VPE apparatus 2000. In the figure, reference numeral 212 denotes a reaction tube of the H-VPE apparatus 2000, and 213 denotes a susceptor of the substrate. An $N_2$ carrier gas 205 and $NH_3$ gas 204 are introduced through an introduction tube 211 under the control of a 5 l/min mass-flow controller 206, and the temperature of the substrate is increased to about 1050° C. Thereafter, 100 cc/min of GaCl is introduced through an introduction tube 208 onto the substrate, thereby initiating the growth of the GaN thick film.

In this operation, the carrier gas may be introduced into the reaction tube 212. GaCl is produced by supplying HCl gas 201 along a Ga metal 207 which is maintained at about 850° C. Optionally, an impurity can be doped during the growth process by supplying an impurity gas through an impurity doping line which independently extends to the vicinity of the substrate. In this embodiment, for the purpose of doping chlorine (Cl), 100 cc/min of $Cl_2$ gas 202 was supplied through an introduction tube 209 simultaneously with the initiation of the growth process. The Cl concentration in the GaN thick film was $2\times10^{16}$ $cm^{-3}$. For the Cl doping, HCl gas may be used instead of the $Cl_2$ gas. When silicon (Si) is doped simultaneously with the Cl, silane ($SiH_4$) 203, monochlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), or the like, may be used. Where the Si is doped, another introduction tube 210 is provided for independently introducing such gases. In this embodiment, 100 nmol/min of $SiH_4$ was supplied in addition to Cl. The Si concentration in the GaN thick film was $2\times10^{18}$ $cm^{-3}$.

In this way, a GaN film 102 (which will be further described later with reference to FIG. 1A) doped with Cl and Si was grown. Cl and Si dopants may be mixed with a carrier gas. The temperature in the vicinity of the Ga boat and the temperature at a position where the substrate is placed can be independently controlled by a heater 215. Any unreacted gas and the carrier gas are discharged through a discharge port 214 and via a pollutant removal apparatus. A growth process is performed for three hours by the above-described method to grow a GaN film having a total thickness of about 350 μm, thereby obtaining a nitride compound semiconductor substrate. The sapphire substrate on which the nitride compound semiconductor substrate is grown may be removed by polishing, etc. The characteristics of the produced light emitting device are improved as an effect of the present invention if thickness of the nitride compound semiconductor substrate is 20 μm or more. As far as the crystal growth of the light emitting device is concerned, the upper limit of the thickness of the nitride compound semiconductor substrate is not limited to any particular value. However, an excessively large thickness may render difficult processes such as the electrode formation, the ridge formation, and the cleaving process. Therefore, the thickness of the nitride compound semiconductor substrate is preferably 1 mm or less, and more preferably 0.5 mm or less.

On the nitride compound semiconductor substrate obtained as described above, a light emitting device structure is grown by using an MOCVD method. A method for growing a semiconductor laser device 1000 having a blue-violet laser device structure on a nitride compound semiconductor substrate from which the sapphire substrate is removed by polishing will be described with reference to FIGS. 1A and 1B.

Figure 1A:
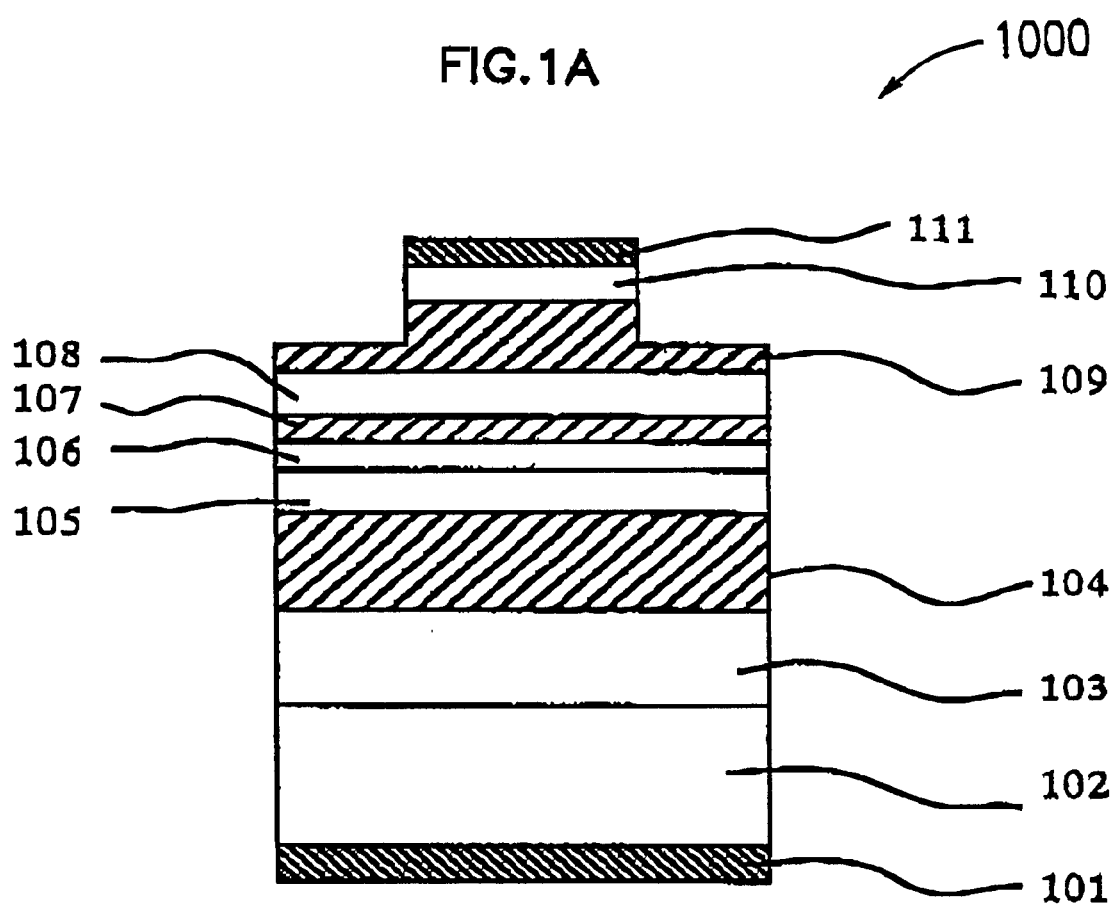
FIG. 1A illustrates a nitride compound semiconductor laser device according to one embodiment of the present invention.
Figure 1B:
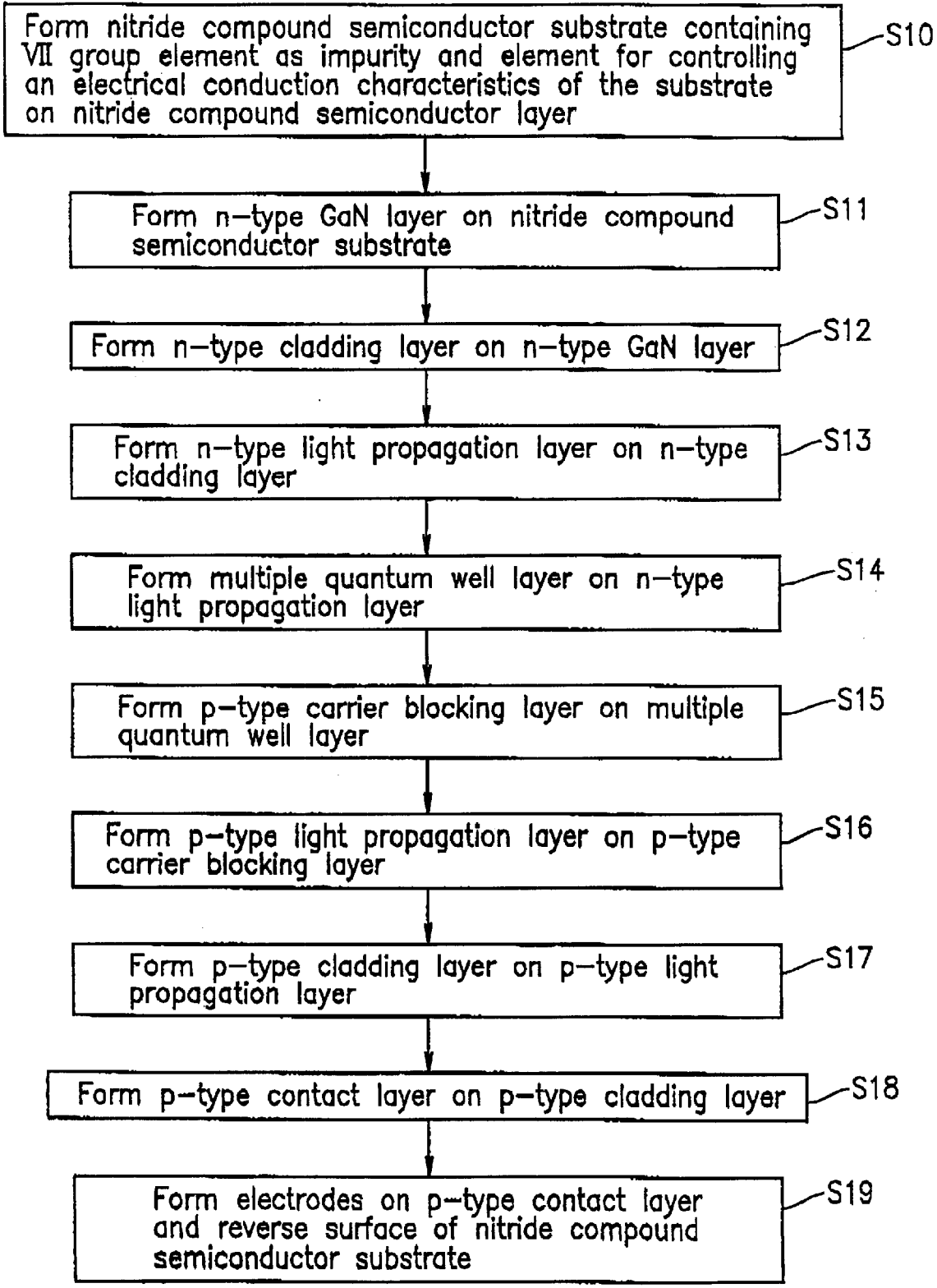
FIG. 1B illustrates a flow chart of a method for producing the nitride compound semiconductor laser device according to one embodiment of the present invention.

FIG. 1A is a cross-sectional view of the semiconductor laser device 1000, and FIG. 1B is a flow chart 1001 illustrating a method for producing the semiconductor laser device 1000.

First, a nitride compound semiconductor substrate 102 is obtained as described above (S10). The nitride compound semiconductor substrate 102 is placed into an MOCVD apparatus, and the temperature inside the apparatus is increased to about 1050° C. while supplying 5 l/min each of $N_2$ and $NH_3$. Once the temperature is increased, 100 μmol/min of TMG and 10 nmol/min of $SiH_4$ are introduced into the apparatus while switching the carrier gas from $N_2$ to $H_2$, growing an n-type GaN film 103 having a thickness of about 4 μm (S11). Thereafter, the flow rate of TMG is adjusted to 50 μmol/min, and 40 μmol/min of TMA is introduced into the apparatus, growing an n-type $Al_{0.1}Ga_{0.9}N$ cladding layer 104 having a thickness of 0.5 μm (S12). After the growth of the cladding layer is complete, the supply of TMA is stopped, and the flow rate of TMG is adjusted to 100 μmol/min, growing an n-type GaN light propagation layer 105 having a thickness of 0.1 μm (S13).

Thereafter, the supply of TMG is stopped, the carrier gas is switched from $H_2$ back to $N_2$, the temperature is decreased to 700° C., and 10 μmol/min of trimethylindium (TMI) as an indium material and 15 μmol/min of TMG are introduced into the apparatus, growing a barrier layer of $In_{0.05}Ga_{0.95}N$ having a thickness of 4 nm. Thereafter, the supply of TMI is increased to 50 μmol/min, and a well layer of $In_{0.2}Ga_{0.8}N$ having a thickness of 2 nm is grown. A total number of three well layers are grown in the same manner. A total of four barrier layers are provided; two interposed between the well layers and the other two extending along the opposite side surfaces of the three-well-layer structure. Thus, there is provided a multiple quantum well (MQW) 106 (S14). After the growth of MQW is complete, the supply of TMI and TMG is stopped, and the temperature inside the apparatus is again increased to 1050° C., the carrier gas is switched again from $N_2$ to $H_2$, and 50 μmol/min of TMG, 30 μmol/min of TMA and 10 nmol/min of biscyclopentadienyl magnesium ($Cp_2Mg$), which is a p-type doping material, are supplied, growing a p-type $Al_{0.2}Ga_{0.8}N$ carrier blocking layer 107 having a thickness of 20 nm (S15).

After the growth of the carrier blocking layer is complete, the supply of TMA is stopped, and the amount of supply of TMG is adjusted to 100 μmol/min, growing a p-type light propagation layer 108 having a thickness of 0.1 μm (S16). Thereafter, the amount of supply of TMG is adjusted to 50 μmol/min, and 40 μmol/min of TMA is introduced into the apparatus, growing a p-type $Al_{0.1}Ga_{0.9}N$ cladding layer 109 having a thickness of 0.4 μm (S17). Finally, the amount of supply of TMG is adjusted to 100 μmol/min, and the supply of TMA is stopped, growing a p-type GaN contact layer 110 having a thickness of 0.1 μm (S18). Thus, the growth of the light emitting device structure is complete. After the growth is complete, the supply of TMG and $Cp_2Mg$ is stopped, and the temperature inside the apparatus is decreased to room temperature, after which the produced structure is taken out of the MOCVD apparatus.

The upper surface (the surface where the growth is terminated) of the film having the laser device structure had a very desirable flatness, with an average surface roughness value (Ra) of about 10 nm.

Thereafter, the produced structure was etched with a dry etching apparatus to the p-type $Al_{0.1}Ga_{0.9}N$ cladding layer 109 so as to leave the p-type GaN contact layer 110 in a stripe pattern with a width of 5 μm, thereby forming an optical waveguide. Then, an Au/Pd electrode 111 was formed on the land portion of the p-type GaN contact layer 110 and an Al/Ti electrode 101 was formed on the reverse surface of the nitride compound semiconductor substrate 102 (S19). Finally, the structure was divided by a cleaving process or a dry etching method into separate devices each having a length of about 1 mm, thereby providing an end face which functions as a mirror.

Thus, a laser device having blue-violet emission wavelengths as illustrated in FIG. 1 was produced by using a nitride compound semiconductor. The laser device produced according to the present embodiment had an oscillation threshold voltage ($V_{op}$) of about 5 V and a threshold current density ($J_{th}$) of about 1 $kA/cm^2$. The laser device had an emission intensity for an injected current of about 2 $kA/cm^2$ which was about 1.5 times as great as that of another laser device produced by using a nitride compound semiconductor substrate not doped with chlorine under similar conditions. The laser device whose substrate was not doped with Cl showed a rapid decrease in its optical output after a continuous oscillation for 500 hours or longer. In contrast, the laser device of the present embodiment whose substrate was doped with Cl did not show such a change in its characteristics even after about 1000 hours.

In the present embodiment, an example where Cl was used as an group VII impurity has been described. It has been confirmed that a similar dislocation-reducing effect can be provided by using a different group VII impurity such as fluorine (F), bromine (B), or iodine (I), instead of Cl. Nevertheless, it is noted that Cl was the impurity which most effectively reduced dislocations among other group VII elements.

In the above-described embodiment, a nitride compound semiconductor substrate was grown on a sapphire substrate, and the sapphire substrate was removed by polishing, after which a nitride compound semiconductor light emitting layer is deposited on the nitride compound semiconductor substrate. It is noted, however, that the similar effects as described above were obtained even when the nitride compound semiconductor light emitting layer was deposited on a nitride compound semiconductor substrate with a sapphire substrate thereon, or when the sapphire substrate was removed by polishing after the nitride compound semiconductor light emitting layer was deposited. Similar effects as described above can be obtained even when the nitride compound semiconductor substrate is not a GaN thick film, as long as the nitride compound semiconductor substrate is a thick film substrate of a nitride compound semiconductor of another composition ($Al_xGa_yIn_{1-x-y}N$: $0 \leq x \leq 1$, $0 \leq y \leq 1$). Similar effects can also be obtained when a part (about 10% or less) of the nitride elements of all the elements forming the nitride compound semiconductor is substituted with P, As, or Sb.

Embodiment 2

Embodiment 2 below will discuss changes in the laser device characteristics of the laser device according to Embodiment 1 above with respect to changes in the amount of Cl impurity doped during the growth of the nitride compound semiconductor substrate. Various laser devices as illustrated in FIG. 1 were produced according to the method as described in Embodiment 1 above with varied amounts of Cl being doped during the growth of the GaN thick film substrate by using the H-VPE method. The characteristics of the produced laser devices were compared with one another.

First, a sapphire substrate with a GaN underlying layer grown thereon having a striped growth suppression film was produced as described in Embodiment 1 above. The substrate was placed into an H-VPE apparatus, and the substrate was heated to a temperature of about 1050° C. while supplying 5 l/min each of an $N_2$ carrier gas and $NH_3$. Thereafter, 100 cc/min of GaCl was introduced onto the substrate as described above, thereby initiating the growth of GaN. Simultaneously with the initiation of the growth, $SiH_4$ gas and $Cl_2$ gas were supplied so as to grow a nitride compound semiconductor substrate doped with Si and Cl to a thickness of 350 μm, and such that there are provided six different nitride compound semiconductor substrates having an Si concentration of $2 \times 10^{18}$ $cm^{-3}$ and respectively varied Cl concentrations of ①0 $cm^{-3}$, ②$1 \times 10^{15}$ $cm^{-3}$, ③$2 \times 10^{16}$ $cm^{-3}$, ④ $2 \times 10^{18}$ $cm^{-3}$, ⑤ $1 \times 10^{20}$ $cm^{-3}$ and ⑥ $2 \times 10^{20}$ $cm^{-3}$. Thereafter, laser device structures were grown as described above and processed to obtain laser devices using the various nitride compound semiconductor substrates.

Figure 3:
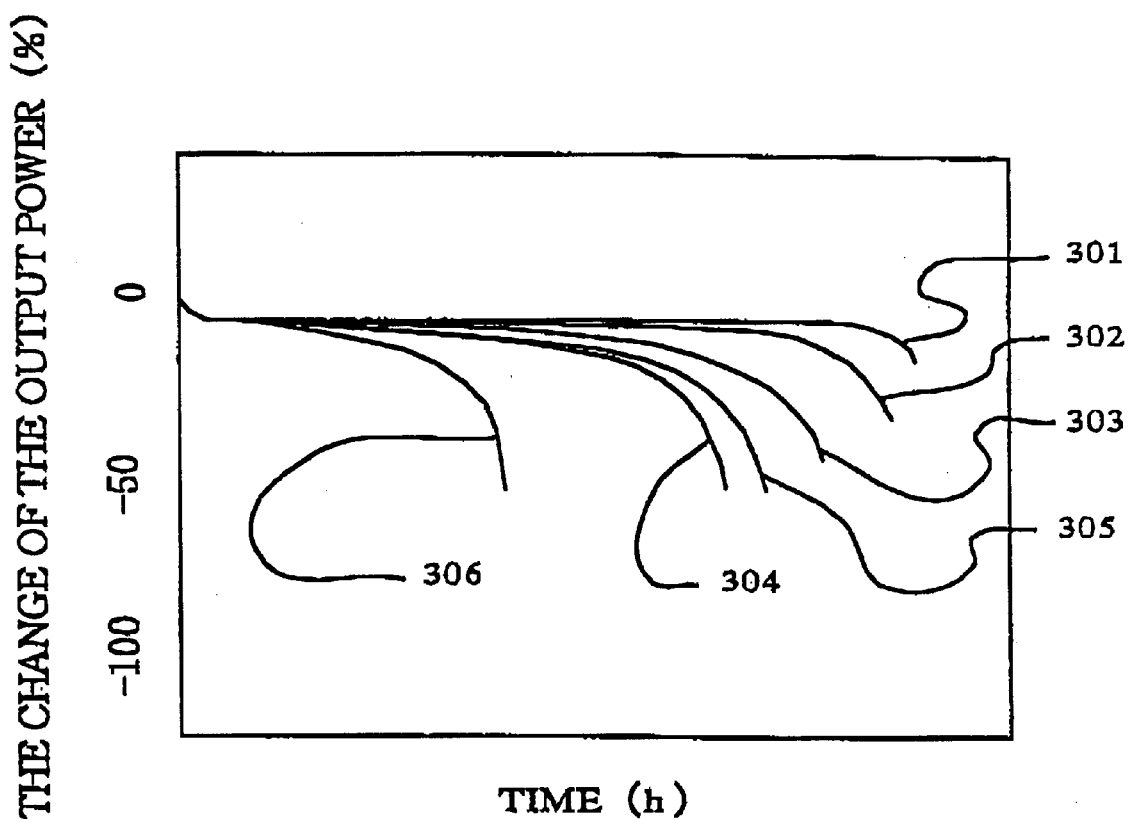
FIG. 3 illustrates operating lifetimes of various laser devices using different nitride compound semiconductor substrates doped with varied concentrations of chlorine, respectively.

FIG. 3 shows the measured changes in emission intensity over time of the produced laser devices when they were supplied with a current density of 1.5 $kA/cm^2$ (about 1.5 times the oscillation threshold current thereof). In FIG. 3, solid lines 301, 302, 303, 304, 305 and 306 correspond to the characteristics of the semiconductor laser devices using the various nitride compound semiconductor substrates having the respective Cl concentrations of ③ $2 \times 10^{16}$ $cm^{-3}$, ④ $2 \times 10^{18}$ $cm^{-3}$, ② $1 \times 10^{15}$ $cm^{-3}$, ① 0 $cm^{-3}$, ⑤ $1 \times 10^{20}$ $cm^{-3}$ and ⑥ $2 \times 10^{20}$ $cm^{-3}$. It can be seen from FIG. 3 that the characteristics of the laser devices produced by using the nitride compound semiconductor substrates to which appropriate amounts of Cl are doped (i.e., solid lines 301, 302, 303, 305) show smaller changes in the optical output over time (i.e., longer operating lifetimes) than those of the laser device using a nitride compound semiconductor substrate to which no Cl is doped (i.e., solid line 304).

In the case where excessive Cl is added (solid line 306), the operating lifetime tends to be shorter. In-depth studies showed that where an impurity for controlling the electrical conduction characteristics of the substrate, e.g., Si, is doped with Cl as in the present embodiment, the effects of the present invention are particularly pronounced when the Cl concentration was equal to or greater than $1 \times 10^{15}$ $cm^{-3}$ and less than or equal to $1 \times 10^{20}$ $cm^{-3}$. It can be seen from FIG. 3 that the optimal value for the Cl concentration is $2 \times 10^{16}$ $cm^{-3}$.

A similar study was conducted with the amount of Si in the nitride compound semiconductor substrate being varied. Various nitride compound semiconductor substrates were produced as described in Embodiment 1 above while varying the amount of $SiH_4$ which was introduced such that the amount of Si included in the respective nitride compound semiconductor substrates were $5 \times 10^{16}$ $cm^{-3}$, $1 \times 10^{17}$ $cm^{-3}$, $5 \times 10^{17}$ $cm^{-3}$, $1 \times 10^{18}$ $cm^{-3}$, $2 \times 10^{18}$ $cm^{-3}$, $5 \times 10^{18}$ $cm^{-3}$, $1 \times 10^{19}$ $cm^{-3}$, $5 \times 10^{19}$ $cm^{-3}$, $1 \times 10^{20}$ $cm^{-3}$, $5 \times 10^{20}$ $cm^{-3}$, $1 \times 10^{21}$ $cm^{-3}$, $5 \times 10^{21}$ $cm^{-3}$, and $1 \times 10^{22}$ $cm^{-3}$. These nitride compound semiconductor substrates were doped with Cl so that the Cl concentration was $2 \times 10^{16}$ cm$^{-3}$, producing various laser devices having the structure as illustrated in FIG. 1 using the respective nitride compound semiconductor substrates. The operating lifetime was measured for each of the produced laser devices, with a point in time at which the optical output therefrom is −20% being considered as the end of the operating lifetime.

Figure 4:
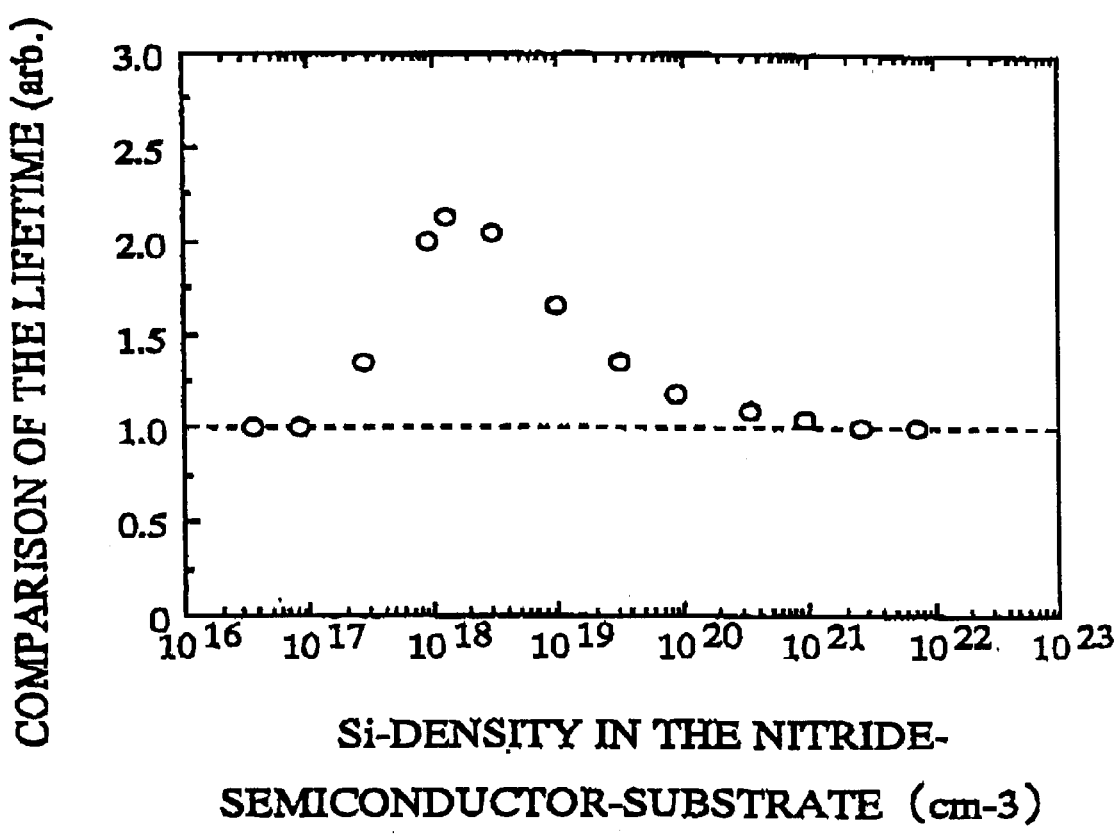
FIG. 4 illustrates a comparison of operating lifetimes among different light emitting devices using various Si concentrations in the nitride compound semiconductor substrate.

Another laser device was produced using a nitride compound semiconductor substrate having the same structure as described above but with no Cl impurity and with the same amount of Si impurity shown above (i.e., $5 \times 10^{16}$ cm$^{-3}$, $1 \times 10^{17}$ cm$^{-3}$, $5 \times 10^{17}$ cm$^{-3}$, $1 \times 10^{18}$ cm$^{-3}$, $2 \times 10^{18}$ cm$^{-3}$, $5 \times 10^{18}$ cm$^{-3}$, $1 \times 10^{19}$ cm$^{-3}$, $5 \times 10^{19}$ cm$^{-3}$, $1 \times 10^{20}$ cm$^{-3}$, $5 \times 10^{20}$ cm$^{-3}$, $1 \times 10^{21}$ cm$^{-3}$, $5 \times 10^{21}$ cm$^{-3}$, and $1 \times 10^{22}$ cm$^{-3}$). The operating lifetime of the laser device was similarly measured. FIG. 4 shows the result of comparison among the various laser device thus produced. In FIG. 4, the broken line indicates the normalized operating lifetime (normalized to a value of 1.0) for laser devices which are produced with no Cl and with varied amounts of Si. Any point (open circle) above the broken line indicates that the Cl doping has given a favorable effect on the operating lifetime of the produced laser device. As can be seen from FIG. 4, the Cl doping is effective for any Si concentration in the nitride compound semiconductor substrate equal to or greater than $1 \times 10^{17}$ cm$^{-3}$ and less than or equal to $5 \times 10^{20}$ cm$^{-3}$. This desirable Si concentration range in the nitride compound semiconductor substrate did not change when the Cl concentration in the substrate is varied in the range of $1 \times 10^{15}$ cm$^{-3}$ to $1 \times 10^{20}$ cm$^{-3}$.

Embodiment 3

Embodiment 3 below will discuss examples where Ge, C, Se, S and O were used instead of Si as an element for controlling the electrical conduction characteristics of the nitride compound semiconductor substrate. Various nitride compound semiconductor substrates were produced by employing combinations of Cl and Ge, Cl and C, Cl and Se, Cl and S, and Cl and O, while controlling the process such that Cl, as a group VII element, is contained in the nitride compound semiconductor substrate in a concentration of $2 \times 10^{16}$ cm$^{-3}$, while the Ge, C, Se, S or O is contained in a concentration of $2 \times 10^{18}$ cm$^{-3}$. Then, a laser device structure is grown on each of the produced substrates as described above to produce a laser device. Each of the produced nitride compound semiconductor substrates exhibited an n-type electrical conductivity.

Due to the favorable influence of the group VIII element, e.g., Cl, none of the impurities used in this embodiment, i.e., Ge, C, Se, S and O, diffused in the nitride compound semiconductor substrate. Thus, each device exhibited desirable voltage-current characteristics, and a longer operating lifetime than that of any laser device which was produced on a nitride compound semiconductor substrate containing no Cl therein. These effects were particularly pronounced when Si, Ge or C, as a group IV element, was used.

In the present embodiment, germane (GeH$_4$), methane (CH$_4$), hydrogen selenide (SeH$_2$), sulfur hydride (SH$_2$), oxygen (O$_2$) were used as doping material for Ge, C, Se, S and O, respectively, to produce a nitride compound semiconductor substrate. It is noted that any other doping material may be used as long as it provides doping effects similar to those described above.

Embodiment 4

Embodiment 4 below will discuss the characteristics of the semiconductor laser device 1000 as described in Embodiment 1 above but with a nitride compound semiconductor substrate which was produced while increasing the amount of Cl impurity doped during the growth of the nitride compound semiconductor substrate toward the upper surface (the surface where the growth is terminated).

Various laser devices were produced according to the method as described in Embodiment 1 above while varying the Cl doping profile during the growth of the nitride compound semiconductor substrate by using the H-VPE method, with the other conditions being unchanged from those used in Embodiment 1. The characteristics of the produced laser devices were compared with one another. First, a sapphire substrate with a GaN underlying layer grown thereon having a striped growth suppression film was produced as described in Embodiment 1 above. The substrate was placed into an H-VPE apparatus, and the substrate was heated to a temperature of about 1050° C. while supplying 5 l/min each of an N$_2$ carrier gas and NH$_3$. Thereafter, 100 cc/min of GaCl was introduced onto the substrate as described above, thereby initiating the growth of GaN. Simultaneously with the initiation of the growth, SiH$_4$ gas and Cl$_2$ gas were supplied such that the impurity concentrations thereof were $2 \times 10^{18}$ cm$^{-3}$ and $1 \times 10^{16}$ cm$^{-3}$, respectively, thus initiating the growth of the nitride compound semiconductor substrate.

The flow rate of the Cl$_2$ gas was changed to various different rates, e.g., 10 sec, 30 sec, 60 sec and 5 min before the completion of the growth of the substrates, so as to produce various nitride compound semiconductor substrates each having a total thickness of 350 μm.

Figure 5:
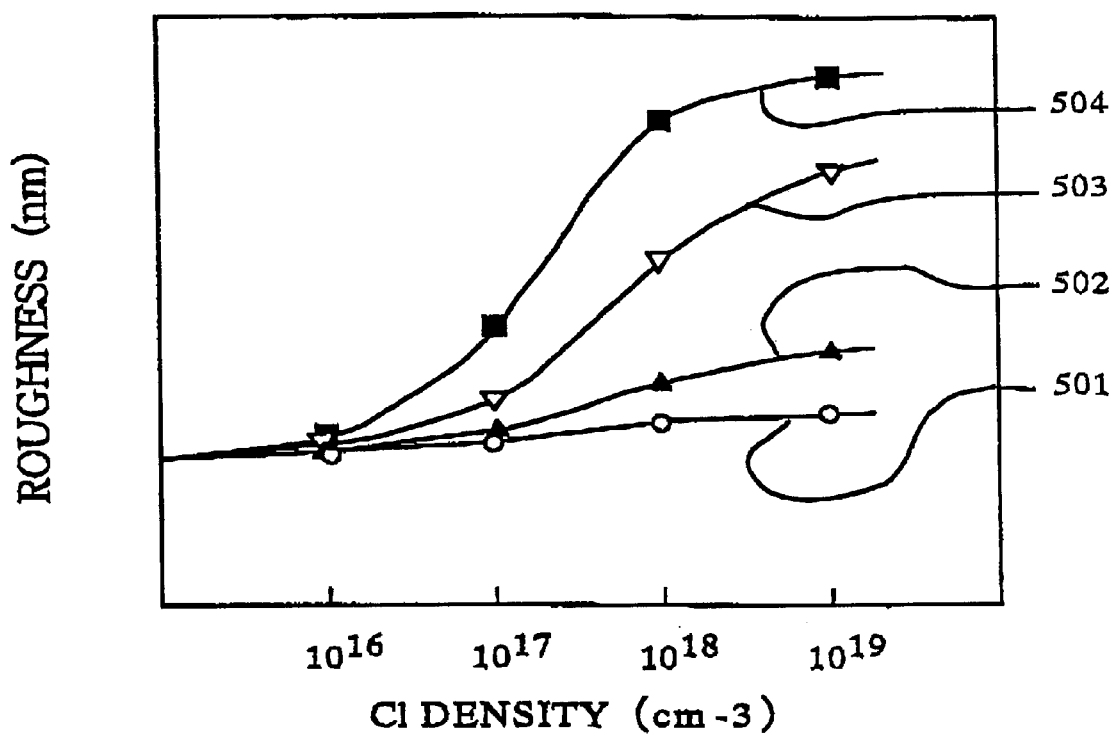
FIG. 5 is a graph showing surface roughnesses of different nitride compound semiconductor substrates doped with varied concentrations of chlorine in the vicinity of the surface of the nitride compound semiconductor substrates.

FIG. 5 illustrates the relationship between the doping amount of chlorine and the surface roughness. In FIG. 5, solid lines 501, 502, 503 and 504 indicate the surface roughnesses of the nitride compound semiconductor substrates obtained by starting increasing the Cl doping amount from a depth of 0.3 μm, 1 μm, 2 μm and 10 μm, respectively, from the surface of the substrate. As shown in FIG. 5, where the Cl doping amount is controlled to start increasing from a depth of 10 μm and a depth of 2 μm from the surface of the nitride compound semiconductor substrate (lines 504 and 503, respectively), the surface roughness of the nitride compound semiconductor substrate increases at a significantly high rate with the increase in the Cl doping amount.

In contrast, where the Cl doping amount is controlled to start increasing from a depth of 1 μm and a depth of 0.3 μm from the surface of the nitride compound semiconductor substrate (lines 502 and 501, respectively), a stable surface condition is obtained with a small surface roughness despite the increase in the Cl concentration in the vicinity of the surface of the substrate.

After the nitride compound semiconductor substrates were grown as described above, laser device structures were grown thereon as described above and processed to obtain the semiconductor laser device 1000 as illustrated in FIG. 1.

Figure 6:
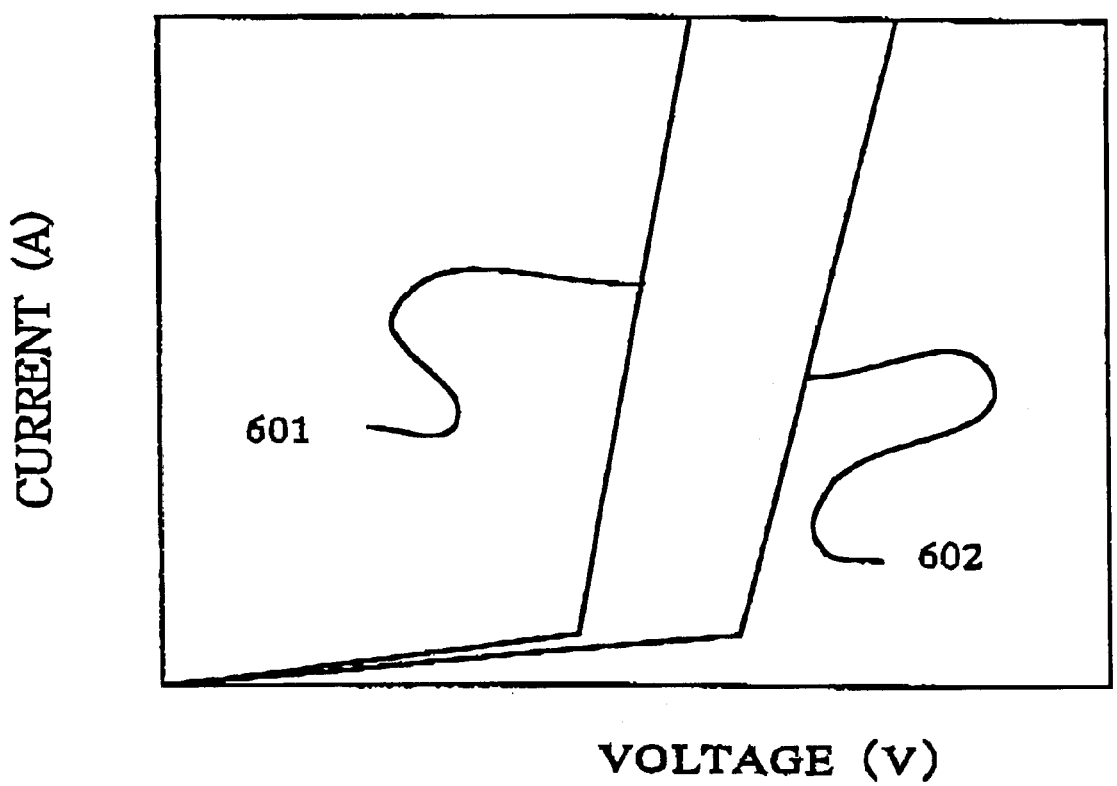
FIG. 6 is a graph showing voltage-current characteristics of laser devices according to one embodiment of the present invention.

FIG. 6 shows voltage-current characteristics of laser devices produced by the method of the present invention. In FIG. 6, solid line 601 indicates voltage-current characteristics of a laser device using a nitride compound semiconductor substrate which was produced by the method of the present invention while the Cl doping amount was controlled to start increasing from $1 \times 10^{16}$ cm$^{-3}$ to $1 \times 10^{18}$ cm$^{-3}$ from a depth of 1 μm from the surface of the nitride compound semiconductor substrate. Solid line 602 indicates voltage-current characteristics of a laser device using a nitride compound semiconductor substrate which was produced by the method of the present invention while the Cl doping amount was maintained at $1 \times 10^{16}$ cm$^{-3}$. FIG. 6 clearly indicates that the increase in the Cl concentration in the vicinity of the nitride compound semiconductor substrate improved the voltage-current characteristics and reduced the threshold voltage. It is believed that such an effect is obtained because the electrical contact between the nitride compound semiconductor substrate and the layer structure having a laser device structure grown thereon is improved without deteriorating the surface roughness by increasing the chlorine concentration in the vicinity of the surface of the nitride compound semiconductor substrate.

Figure 7:
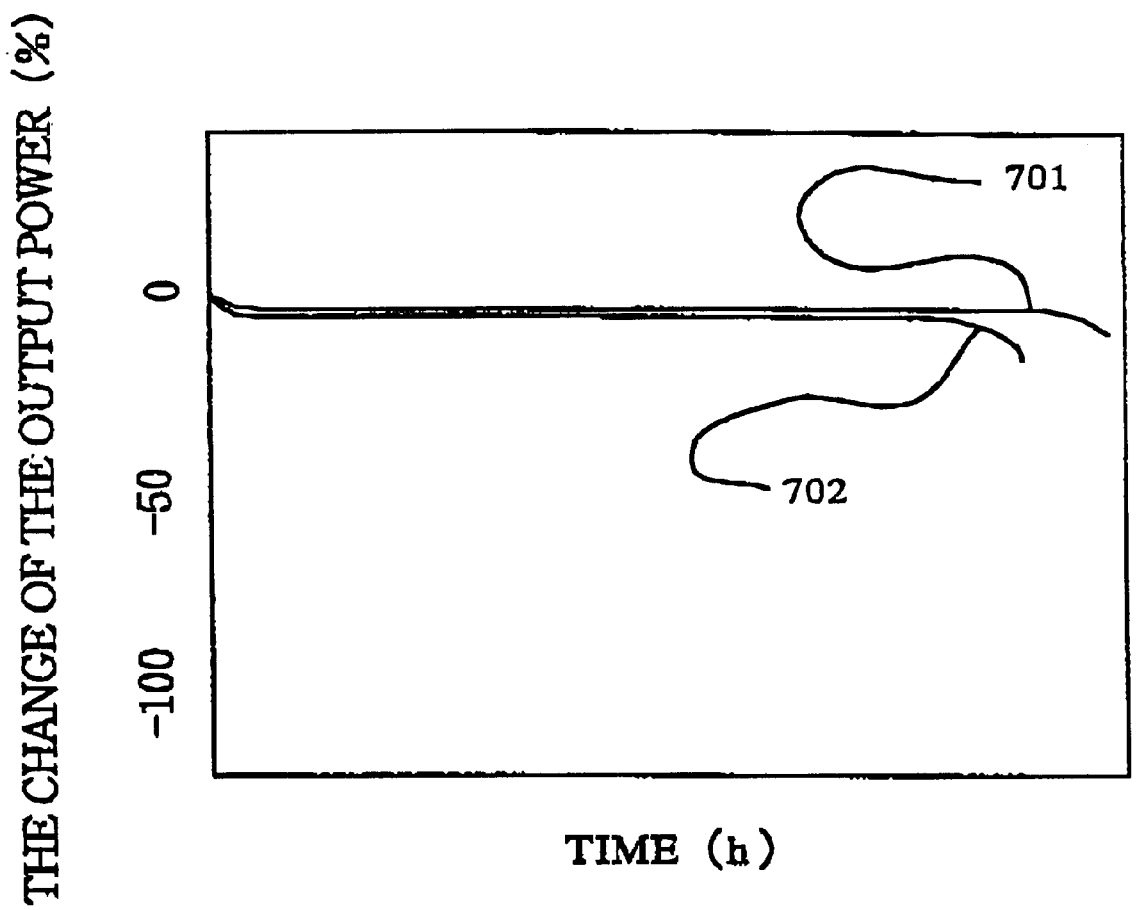
FIG. 7 is a graph showing operating lifetimes of laser devices according to one embodiment of the present invention.

FIG. 7 shows changes over time in the emission intensity of laser devices exhibiting the voltage-current characteristics indicated by solid lines 601 and 602 in FIG. 6, as a current density of 1.5 kA/cm$^2$ (about 1.5 times the oscillation threshold current) is supplied to the laser devices. In FIG. 7, solid lines 701 and 702 indicate operating lifetimes of the devices which exhibit voltage-current characteristics of solid lines 601 and 602, respectively. As can be seen from FIG. 7, the operating lifetime can also be improved by increasing the Cl concentration in the vicinity of the surface of the nitride compound semiconductor substrate.

Figure 13:
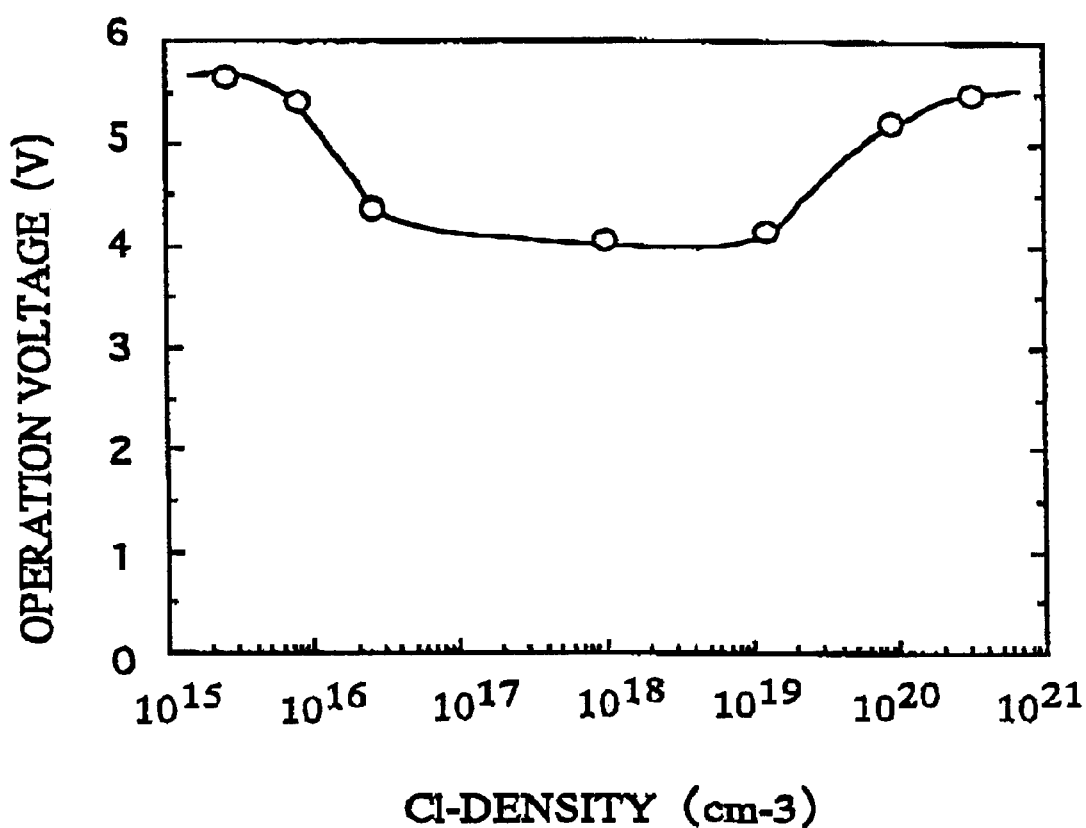
FIG. 13 is a graph showing the relationship between the chlorine concentration in the vicinity of the surface of the nitride compound semiconductor substrate of the nitride compound semiconductor laser device according to the present invention and the operation voltage.

In-depth studies showed that it is possible to improve the operating lifetime of a semiconductor laser device by controlling the chlorine concentration to start increasing from a depth of 2 μm or less from the surface of the nitride compound semiconductor substrate. A particularly desirable operating lifetime was realized when the Cl concentration in other portions of the nitride compound semiconductor substrate which are not in the vicinity of the surface of the substrate was $5\times10^{16}$ cm$^{-3}$ of less. It has been also found that the improvement of the voltage-current characteristics (particularly, the reduction in the operation voltage) is dependent upon the chlorine concentration in the vicinity of the surface of the nitride compound semiconductor substrate. FIG. 13 shows the relationship between the chlorine concentration at a depth of 0.05 μm from the surface of the nitride compound semiconductor substrate and the operation voltage of the laser device. As shown in FIG. 13, the operation voltage is reduced when the Cl concentration at a depth of 0.05 μm from the surface of the nitride compound semiconductor substrate is equal to or greater than $1\times10^{16}$ cm$^{-3}$ and less than or equal to $1\times10^{20}$ cm$^{-3}$. More preferably, the Cl concentration at a depth of 0.05 μm from the surface of the nitride compound semiconductor substrate is equal to or greater than $5\times10^{16}$ cm$^{-3}$ and less than or equal to $1\times10^{19}$ cm$^{-3}$. With such values, the operating lifetime of a laser device was significantly improved.

Embodiment 5

Figure 8:
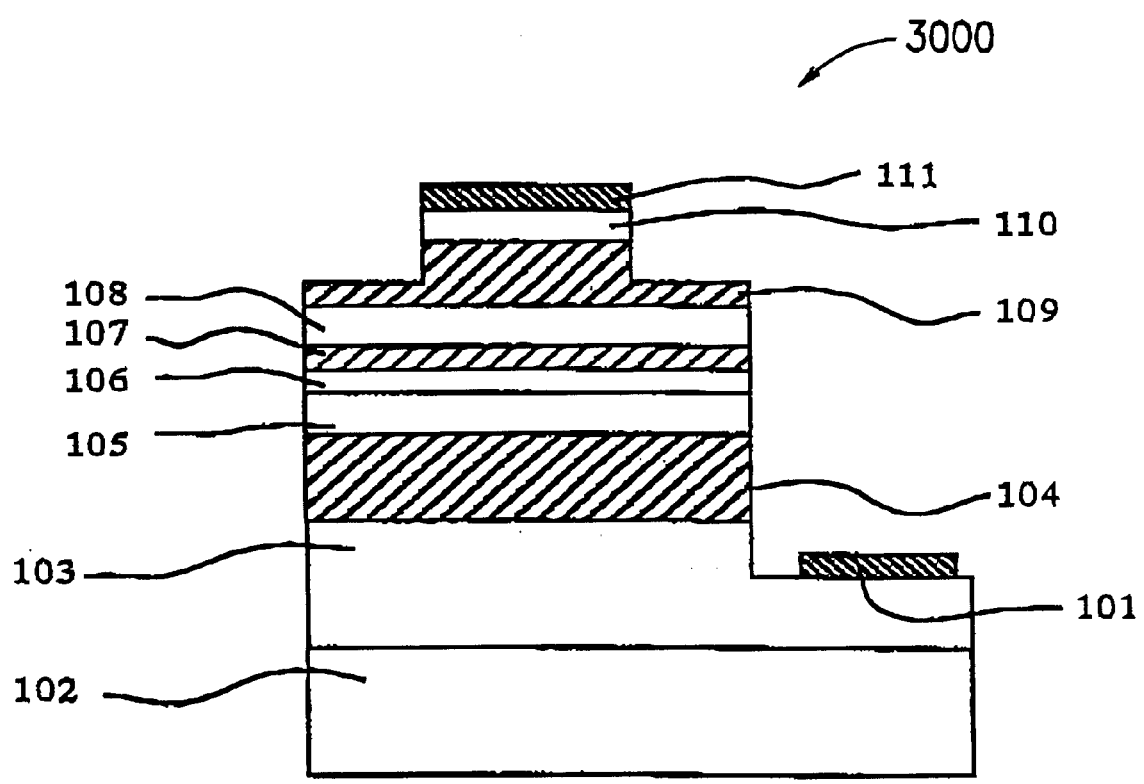
FIG. 8 illustrates a nitride compound semiconductor laser device according to one embodiment of the present invention.

Embodiment 5 below will discuss a semiconductor laser device 3000 having a structure as illustrated in FIG. 8. The semiconductor laser device 3000 illustrated in FIG. 8 includes a Cl-doped nitride compound semiconductor substrate which is grown by the H-VPE method as described in Embodiment 1 above. It is noted that in this embodiment, a current is not conducted directly through the substrate, whereby it is not necessary to perform a doping with Si, Mg, or the like, for controlling the electrical conduction characteristics of the substrate. As described in Embodiment 1 above, a Cl-doped GaN nitride compound semiconductor substrate having a thickness of about 350 μm was grown in three hours while introducing a Cl$_2$ gas at a flow rate of 100 cc/min. Thereafter, respective layers of the laser device structure were grown by the MOCVD method as described above, and ridges were formed by using a dry etching apparatus. Then, an Au/Pd electrode was formed on the ridge portion. In order to from an n-side electrode, the produced structure was etched to the n-type GaN film 103 by using a dry etching apparatus. Then, an Al/Ti electrode was formed on an exposed portion of the n-type GaN film 103, thus producing a laser device.

The semiconductor laser device 3000 grown on the Cl-containing nitride compound semiconductor substrate as described above had a dislocation density in the laser device that was smaller than that of a similarly produced nitride compound semiconductor light emitting device not doped with Cl by about an order of magnitude or more, due to the dislocation-reducing effect of Cl. Due to the dislocation-reducing effect, the operating lifetime of the laser device was improved by a factor of about 2.

The laser device of this embodiment uses a nitride compound semiconductor substrate from which a base substrate, e.g., a sapphire substrate (on which a nitride compound semiconductor is grown), has been removed by polishing. However, in the structure of this embodiment, it is not necessary to provide an electrode on the reverse side of the nitride compound semiconductor substrate (i.e., the side of the substrate that is opposite to the side on which a laser device structure is grown by a vapor phase epitaxy). Therefore, it is not necessary to remove the base substrate, which may be an insulator.

In such a case, the nitride compound semiconductor substrate needs to have a thickness of at least 20 μm or more in order to reduce the dislocation density as an effect of the Cl doping. When the thickness is over 20 μm, it is effective to employ a selective growth method with a growth suppression film in order to prevent a crack from occurring in the film. In such a case, the dislocation-reducing effect is further promoted.

Figure 9:
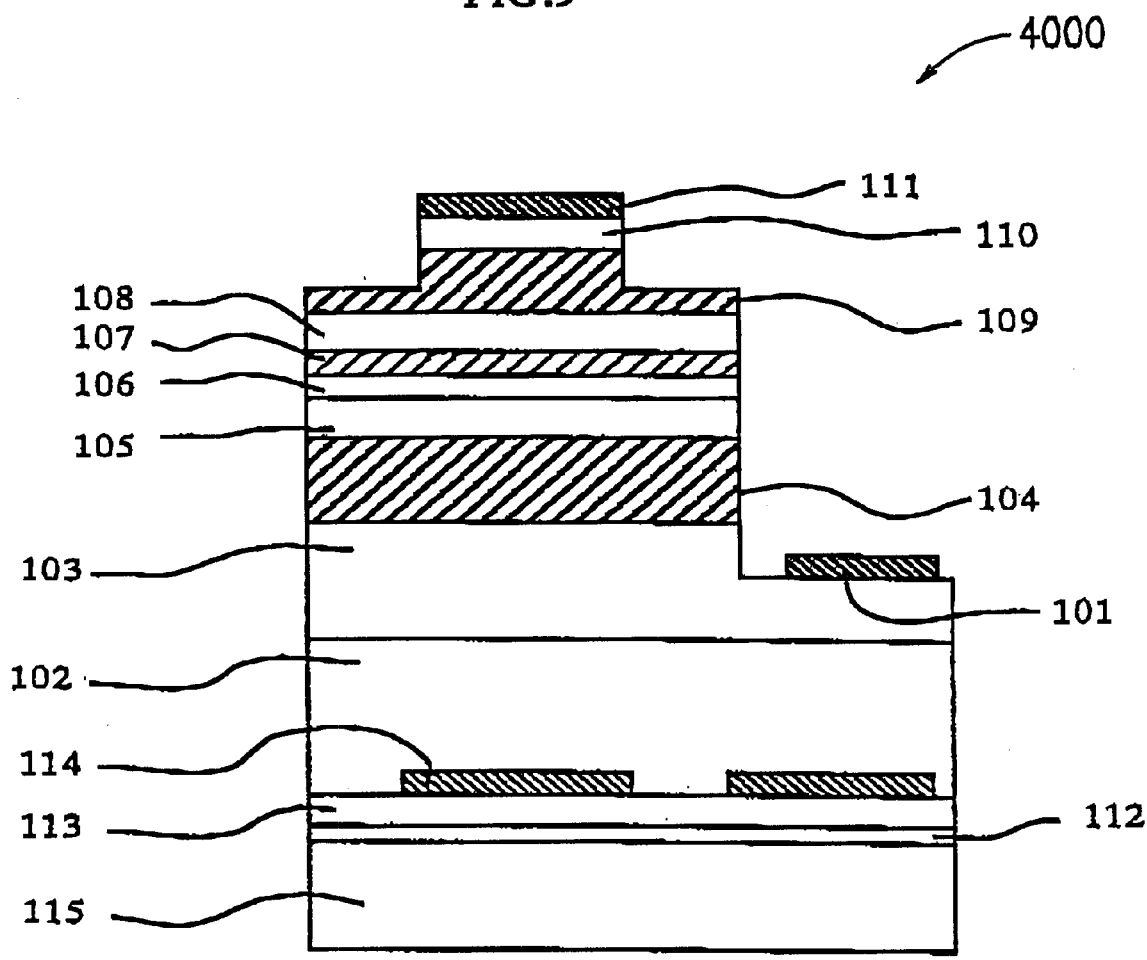
FIG. 9 illustrates another nitride compound semiconductor laser device according to one embodiment of the present invention.

FIG. 9 is a schematic diagram illustrating a semiconductor laser device 4000 produced on the Cl-doped nitride compound semiconductor substrate 102 having a thickness of 50 μm with the base substrate being not removed by polishing. A base substrate 115 such as a sapphire substrate, a GaN or AlN low temperature buffer layer 112 having a thickness of about 20 nm, an epitaxially grown GaN film 113 having a thickness of about 3 μm, and a growth suppression film 114 made of SiO$_2$, or the like, are not removed by polishing. Even then, due to the dislocation-reducing effect of Cl in the nitride compound semiconductor substrate, the operating lifetime of such a laser device was about 1.5 times better than that of another laser device of the same structure but without Cl doping.

Figure 12:
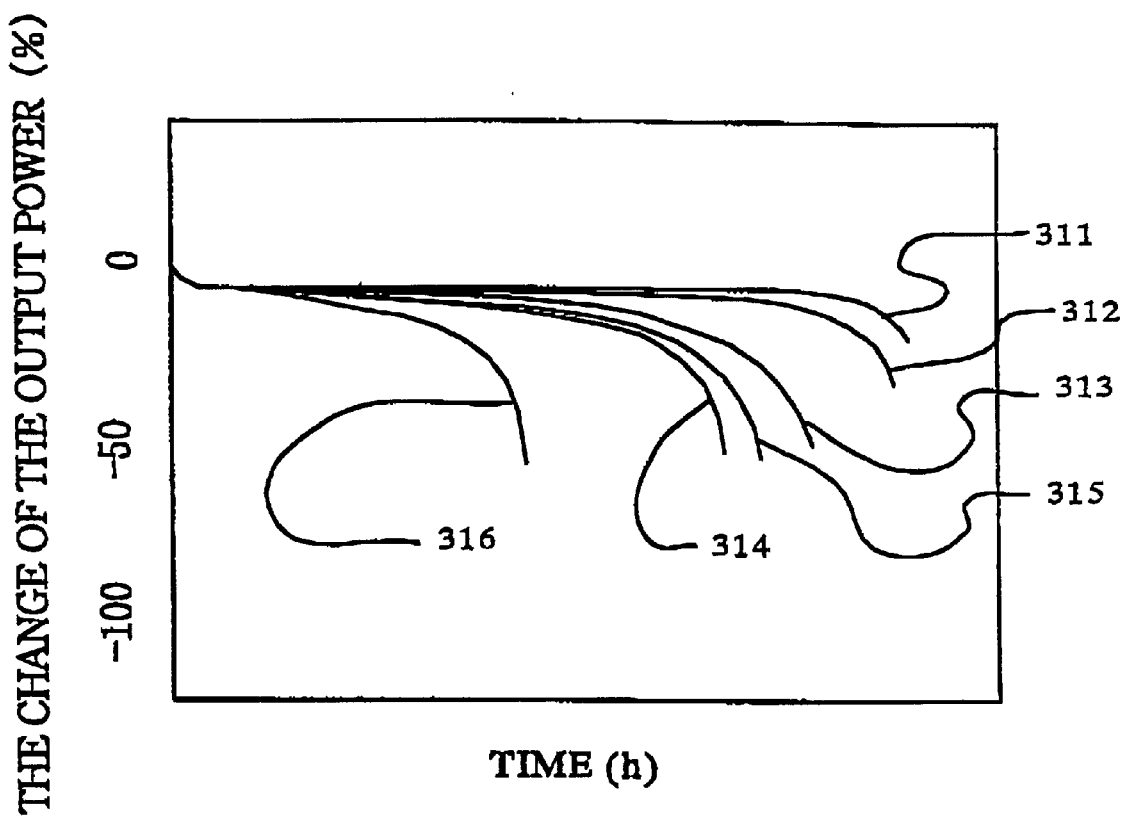
FIG. 12 is a graph showing operating lifetimes of various laser devices according to one embodiment of the present invention.

FIG. 12 shows changes over time in the emission intensity of the semiconductor laser devices 4000 produced to have a structure as illustrated in FIG. 9 as a current density of 1.5 kA/cm$^2$ (about 1.5 times the oscillation threshold current) is supplied to the laser devices. In FIG. 12, solid lines 311, 312, 313, 314, 315 and 316 indicate the characteristics of the semiconductor laser devices 4000 using various nitride compound semiconductor substrates containing Cl in varied amounts of $2\times10^{16}$ cm$^{-3}$, $2\times10^{18}$ cm$^{-3}$, $2\times10^{14}$ cm$^{-3}$, 0 cm$^{-3}$, $2\times10^{20}$ cm$^{-3}$ and $4\times10^{20}$ cm$^{-3}$, respectively. It can be seen from FIG. 12 that the characteristics of the laser devices produced by using the nitride compound semiconductor substrates to which appropriate amounts of Cl are doped (i.e., solid lines 311, 312, 313, 315) show smaller changes in the optical output over time (i.e., longer operating lifetimes) than those of the laser device using a nitride compound semiconductor substrate to which no Cl is doped (i.e., solid line 314). In the case where excessive Cl is added (solid line 316), the operating lifetime tends to be shorter. In-depth studies showed that the effects of the present invention can be obtained when the Cl concentration in the nitride compound semiconductor substrate is equal to or greater than $2\times10^{14}$ cm$^{-3}$ and less than or equal to $2\times10^{20}$ cm$^{-3}$. More preferably, the Cl concentration is equal to or greater than $1\times10^{15}$ cm$^{-3}$ and less than or equal to $1\times10^{17}$ cm$^{-3}$. With such values, the effects of the present invention were particularly pronounced.

Embodiment 6

Embodiment 6 below will discuss an example where the Cl concentration was increased in the vicinity of the surface of the nitride compound semiconductor substrate in the semiconductor laser device 3000 as illustrated in FIG. 8.

As in Embodiment 4 above, a Cl-doped nitride compound semiconductor substrate is grown by using the H-VPE method. From when the growth of the nitride compound semiconductor substrate was initiated, Cl$_2$ was introduced at a flow rate of 10 cc/min (the Cl concentration introduced into the substrate was $5\times10^{15}$ cm$^{-3}$). The amount of the Cl$_2$ gas introduced was increased from 10 cc/min to 500 cc/min 30 sec before the completion of the growth of the nitride compound semiconductor substrate so that a nitride compound semiconductor substrate having a total thickness of 350 $\mu$m was produced in 3 hours. The semiconductor laser device 3000 using the nitride compound semiconductor substrate grown as described above had a reduced dislocation density as low as that of the semiconductor laser device 3000 of Embodiment 4. Moreover, the semiconductor laser device 3000 of Embodiment 6 had a reduced surface roughness as small as about one half of that of the semiconductor laser device 3000 of Embodiment 4. Thus, the diffusion of light propagating through the guide layer of the laser device was reduced, whereby it was possible to reduce the oscillation threshold current by about 20%.

The dislocation was effectively reduced when the chlorine in the nitride compound semiconductor substrate had a concentration of at least about $2\times10^{14}$ cm$^{-3}$ across the entire surface of the substrate. The effects of the chlorine doping were provided even when the doping was not performed across the whole substrate as long as there was a chlorine concentration of at least $1\times10^{16}$ cm$^{-3}$ or more at a depth of 2 $\mu$m or less from the surface of the substrate.

Figure 10:
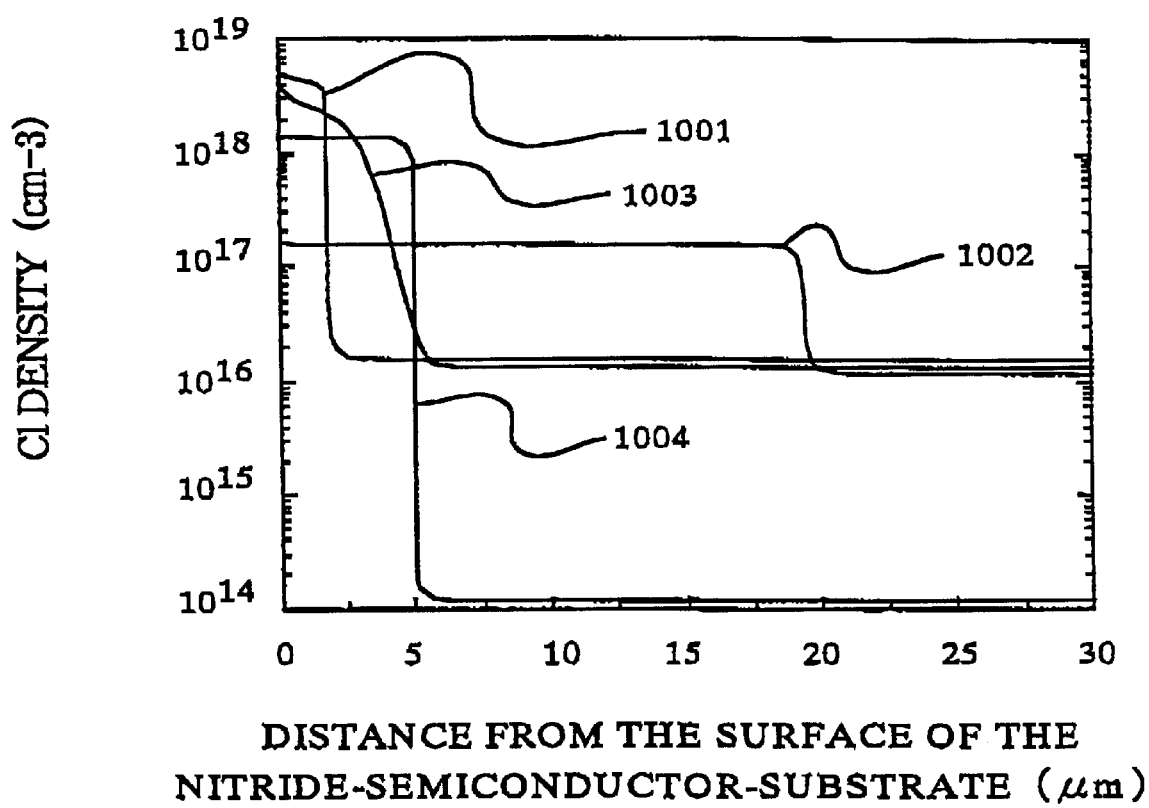
FIG. 10 is a graph showing chlorine concentrations in the nitride compound semiconductor substrate which have been confirmed to provide the advantageous effects of the present invention.

FIG. 10 illustrates a few examples where the effects of the present invention were provided by the semiconductor laser devices 3000 which were produced by using various nitride compound semiconductor substrates having Cl concentrations which were varied in the vicinity of the nitride compound semiconductor substrates. In FIG. 10, solid line 1001 illustrates a case where the Cl doping concentration was increased to a relatively high concentration (about $5\times10^{18}$ cm$^{-3}$) in a region in the vicinity of the nitride compound semiconductor substrate (in the depth range of 0 $\mu$m to about 0.1 $\mu$m). Solid line 1002 illustrates a case where the Cl doping concentration was increased to a relatively low concentration in a region at a depth (about 2 $\mu$m) from the surface of the nitride compound semiconductor substrate. Solid line 1003 illustrates a case where the Cl concentration was increased with a gradient in the vicinity of the surface of the nitride compound semiconductor substrate. Solid line 1004 illustrates a case where Cl was doped only in the vicinity of the surface of the nitride compound semiconductor substrate. Although not shown in FIG. 10, effects similar to those described above were confirmed when the Cl concentration was increased with a gradient only in the vicinity of the surface of the nitride compound semiconductor substrate or when the Cl concentration was changed through 2 or 3 or more steps in the vicinity of the surface of the nitride compound semiconductor substrate.

Figure 11:
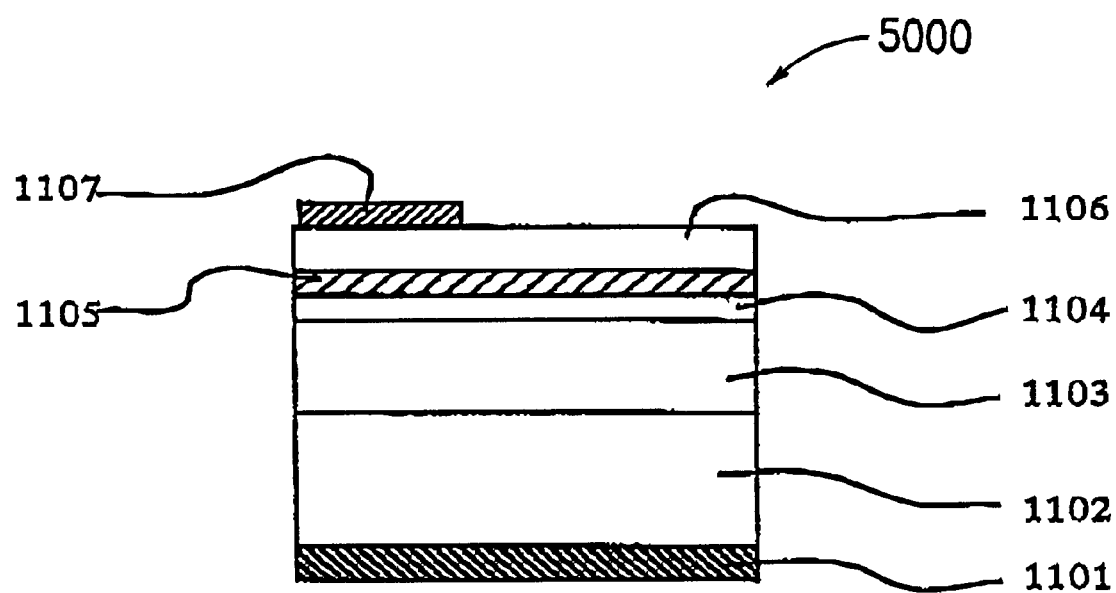
FIG. 11 illustrates a light emitting diode according to one embodiment of the present invention.

Although each of the above-described embodiments is directed to a laser device as one type of a light emitting device, the present invention is also effective for light emitting diodes. FIG. 11 is a schematic diagram illustrating an exemplary light emitting diode 5000 according to the present invention. The light emitting diode 5000 includes an n-type ohmic electrode 1101 made of an Al/Ti material, or the like, a Cl- and Si-doped nitride compound semiconductor substrate 1102 exhibiting an n-type conductivity, an Si-doped n-type GaN film 1103 having a thickness of about 4 $\mu$m, a light emitting layer 1104 including a number of InGaN layers having a total thickness of a few nanometers, a p-type AlGaN carrier blocking layer 1105 having a thickness of about 20 nm, an Mg-doped p-type GaN film 1106 having a thickness of about 0.1 $\mu$m, and a p-type ohmic electrode 1107 made of Au/Pd, or the like.

It is expected that the present invention provides the advantageous effects for any type of electronic device which may be influenced by dislocations in the crystal. The characteristics of the light emitting device grown on a nitride compound semiconductor substrate can be improved by the advantageous effects of the present invention as long as the thickness of the nitride compound semiconductor substrate is 20 $\mu$m or more. As far as the crystal growth is concerned, there is no upper limit for the thickness of the nitride compound semiconductor substrate. However, an excessively large thickness may render difficult processes such as the electrode formation, the ridge formation, and the cleaving process. Therefore, the thickness of the nitride compound semiconductor substrate is preferably 1 mm or less, and more preferably 0.5 mm or less.

As described above, according to the present invention, a light emitting device is formed on a nitride compound semiconductor substrate having a thickness of 20 $\mu$m or more, and the nitride compound semiconductor substrate contains a group VII element as an impurity. In this way, it is possible to reduce the crystal defects in the light emitting device to be grown on the substrate, thereby improving the operating lifetime of the light emitting device. Furthermore, when the group VII element is included in the nitride compound semiconductor substrate along with an impurity for controlling the electrical conduction characteristics of the substrate, it is possible to reduced the diffusion of the impurity for controlling the electrical conduction characteristics of the substrate, thereby improving the voltage-current characteristics and the operating lifetime of the device. Moreover, when the chlorine concentration in the vicinity of the surface of the substrate is increased to a predetermined value, it is possible to reduce dislocations without increasing the surface roughness of the light emitting device grown on the nitride compound semiconductor substrate, thereby further improving the voltage-current characteristics and the operating lifetime of the device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nitride compound semiconductor light emitting device, comprising:
   a nitride compound semiconductor substrate; and
   a light emitting device section including a nitride compound semiconductor provided on the nitride compound semiconductor substrate, wherein
      the nitride compound semiconductor substrate contains a group VII element as an impurity, and
      the nitride compound semiconductor substrate has a thickness of 20 $\mu$m or more.

2. A nitride compound semiconductor light emitting device, comprising:

a nitride compound semiconductor substrate; and a light emitting device section including a nitride compound semiconductor provided on the nitride compound semiconductor substrate, wherein the nitride compound semiconductor substrate contains a group VII element as an impurity, and a concentration of the group VII element contained in the nitride compound semiconductor substrate is equal to or greater than $2 \times 10^{14}$ cm$^{-3}$ and less than or equal to $2 \times 10^{20}$ cm$^{-3}$.

3. A nitride compound semiconductor light emitting device according to claim 2, wherein the nitride compound semiconductor substrate contains as its main components nitride and gallium.

4. A nitride compound semiconductor light emitting device according to claim 2, wherein the light emitting device section comprises:

a nitride compound layer for a first conductivity type;

a cladding layer of the first conductivity type provided on the nitride compound layer of the first conductivity type;

a light propagation layer of the first conductivity type provided on the cladding layer of the first conductivity type:

a well layer provided on the light propagation layer of the first conductivity type;

a carrier blocking layer of a second conductivity type provided on the well layer;

a light propagation layer of the second conductivity type provided on the carrier blocking layer of the second conductivity type;

a cladding layer of the second conductivity type provided on the light propagation layer of the second conductivity type; and a contact layer of the second conductivity type provided on the cladding layer of the second conductivity type.

5. A nitride compound semiconductor light emitting device according to claim 2, wherein the nitride compound semiconductor substrate has a thickness of 20 μm or more.

6. A nitride compound semiconductor light emitting device according to claim 2, wherein the group VII element is chlorine.

7. A nitride compound semiconductor light emitting device according to claim 2, wherein the nitride compound semiconductor substrate contains an impurity for controlling electrical conduction characteristics of the nitride compound semiconductor substrate.

8. A nitride compound semiconductor light emitting device according to claim 7, wherein:

the impurity for controlling the electrical conduction characteristics of the nitride compound semiconductor substrate is at least one element selected from the group consisting of silicon, germanium, carbon, selenium, sulfur and oxygen; and a concentration of the at least one element is equal to or greater than $1 \times 10^{17}$ cm$^{-3}$ and less than or equal to $5 \times 10^{20}$ cm$^{-3}$.

9. A nitride compound semiconductor light emitting device according to claim 8, wherein:

the group VII element is chlorine; and a concentration of the chlorine contained in the nitride compound semiconductor substrate is equal to or greater than $1 \times 10^{15}$ cm$^{-3}$ and less than or equal to $1 \times 10^{20}$ cm$^{-3}$.

10. A nitride compound semiconductor light emitting device according to claim 2, wherein the concentration of the group VII element contained in the nitride compound semiconductor substrate in the vicinity of a surface of the nitride compound semiconductor substrate on which the light emitting device section is deposited is greater than that in other portions of the nitride compound semiconductor substrate.

11. A nitride compound semiconductor light emitting device according to claim 10, wherein:

the group VII element is chlorine; and a concentration of the chlorine in a region of the nitride compound semiconductor substrate at a depth of 2 μm or less from the surface of the nitride compound semiconductor substrate is greater than those in other regions of the nitride compound semiconductor substrate.

12. A nitride compound semiconductor light emitting device according to claim 10, wherein:

the group VII element is chlorine; and a concentration of the chlorine in a region of the nitride compound semiconductor substrate at a depth of about 0.05 μm from the surface of the nitride compound semiconductor substrate is equal to or greater than $1 \times 10^{16}$ cm$^{-3}$ and less than or equal to $1 \times 10^{20}$ cm$^{-3}$.

* * * * *